United States Patent
Chen et al.

(10) Patent No.: US 11,611,007 B1
(45) Date of Patent: Mar. 21, 2023

(54) SPECIAL-FIGURE DESIGN RIBBON FOR CONNECTING BACK CONTACT CELLS

(71) Applicant: Solarlab Aiko Europe GmbH, Freiburg (DE)

(72) Inventors: Wenhua Chen, Yiwu (CN); Bao'an Wu, Yiwu (CN); Xian Li, Yiwu (CN); Gang Chen, Yiwu (CN)

(73) Assignee: SOLARLAB AIKO EUROPE GMBH, Freiburg (DE)

( * ) Notice: Subject to any disclaimer, the term of this patent is extended or adjusted under 35 U.S.C. 154(b) by 0 days.

(21) Appl. No.: 17/841,628

(22) Filed: Jun. 15, 2022

(30) Foreign Application Priority Data

Feb. 18, 2022 (CN) .......................... 202210149219.2

(51) Int. Cl.
*H01L 31/05* (2014.01)

(52) U.S. Cl.
CPC ................. *H01L 31/0516* (2013.01)

(58) Field of Classification Search
CPC . Y02E 10/50; H01L 31/022441; H01L 31/05; H01L 31/0504; H01L 31/0508; H01L 31/0516
See application file for complete search history.

(56) References Cited

U.S. PATENT DOCUMENTS

| 6,315,575 | B1 | 11/2001 | Kajimoto |
| 2008/0083453 | A1 | 4/2008 | Rose et al. |
| 2010/0144218 | A1 | 6/2010 | Rose et al. |
| 2011/0073166 | A1 | 3/2011 | Lee |
| 2012/0074576 | A1 | 3/2012 | Linderman et al. |
| 2014/0157580 | A1* | 6/2014 | Fukumochi ......... H01L 31/0516 29/593 |
| 2014/0157594 | A1* | 6/2014 | Yoshimine ............ H01R 43/26 29/857 |

FOREIGN PATENT DOCUMENTS

| CN | 103515360 | A | | 1/2014 |
| CN | 105552155 | A | | 5/2016 |
| CN | 111900225 | A | | 11/2020 |
| CN | 113659023 | A | | 11/2021 |
| EP | 2752887 | A1 | | 7/2014 |
| JP | 2005142282 | A | * | 6/2005 ......... H01L 31/0508 |

OTHER PUBLICATIONS

Machine translation of JP-2005142282-A, Suzuki Y. (Year: 2005).*

* cited by examiner

*Primary Examiner* — Mayla Gonzalez Ramos
(74) *Attorney, Agent, or Firm* — Matthias Scholl P.C.; Matthias Scholl

(57) ABSTRACT

A special-figure design ribbon for connecting back contact cells includes a body, a plurality of first solder joints, and a plurality of second solder joints. The plurality of first solder joints and the plurality of second solder joints are respectively located on two sides of the body in a width direction. Each of the first solder joints stretches outward from a first side of the body. Each of the second solder joints stretches outward from a second side of the body. A shape of each first solder joint is different from a shape of each second solder joint. Center lines of at least one set of the first solder joint and the second solder joint adjacent to each other are staggered from each other in the width direction of the body.

22 Claims, 4 Drawing Sheets

SPECIAL-FIGURE DESIGN RIBBON FOR CONNECTING BACK CONTACT CELLS

CROSS-REFERENCE TO RELATED APPLICATIONS

Pursuant to 35 U.S.C. § 119 and the Paris Convention Treaty, this application claims foreign priority to Chinese Patent Application No. 202210149219.2 filed Feb. 18, 2022, the contents of which, including any intervening amendments thereto, are incorporated herein by reference. Inquiries from the public to applicants or assignees concerning this document or the related applications should be directed to: Matthias Scholl P C., Attn.: Dr. Matthias Scholl Esq., 245 First Street, 18th Floor, Cambridge, Mass. 02142.

BACKGROUND

This application belongs to the technical field of solar cells, and in particular, to a special-figure design ribbon for connecting back contact cells.

A solar cell generates electricity through converting sunlight into electric energy by means of a photovoltaic effect of a semiconductor p-n junction, which is a sustainable source of clean energy.

Conventionally, a plurality of solar cells is usually connected as a whole by using a ribbon, so as to be packaged into a cell module by using processes such as laying, lamination, and the like. However, due to the thermal mismatch between the ribbon and the solar cells, that is, different proportional coefficients of thermal expansion and contraction with temperature variation, solar cells and ribbons could be squeezed in cracks and fragments, because the stress between the solar cells and the ribbon is too big to release. Thermal expansion and contraction of the ribbon may also cause the cells to be subjected to an expansion stress of the ribbon, resulting in cracks and fragmenting of the solar cells.

Based on this, how to design a ribbon to minimize the damage of stress to the solar cells becomes a problem to be resolved.

SUMMARY

This application provides a special-figure design ribbon for connecting back contact cells, to resolve a problem of how to design a ribbon to minimize the damage of stress to the solar cells.

According to a first aspect, a special-figure design ribbon for connecting back contact cells provided in this application includes:

a body; and a plurality of first solder joints and a plurality of second solder joints, respectively located on two sides of the body in a width direction, where each of the first solder joints stretches outward from a first side of the body;

each of the second solder joints stretches outward from a second side of the body; and a shape of each first solder joint is different from a shape of each second solder joint; and/or center lines of at least one set of the first solder joint and the second solder joint adjacent to each other are staggered from each other in the width direction of the body.

Optionally, the body comprises a plurality of slits, and an end of each of the slits forms an opening on the body.

Optionally, each first solder joint corresponds to a set of slits, and a slit in the set of slits at a larger distance from the corresponding first solder joint in a length direction is at a larger distance from the corresponding first solder joint in the width direction; and/or each second solder joint corresponds to a set of slits, and a slit in the set of slits at a larger distance from the corresponding second solder joint in a length direction is at a larger distance from the corresponding second solder joint in the width direction.

Optionally, the set of slits include a first slit, a second slit, a third slit, a fourth slit, and a fifth slit, the first slit is located in the middle of the set of slits, and the second slit and the third slit are respectively located on two sides of the first slit; the fourth slit is located on a side of the second slit facing away from the first slit, and the fifth slit is located on a side of the third slit facing away from the first slit; and lengths of the set of slits satisfy the following relationship:

$L1>L2=L3>L4=L5$, where $L1$ is the length of the first slit, $L2$ is the length of the second slit, $L3$ is the length of the third slit, $L4$ is the length of the fourth slit, and $L5$ is the length of the fifth slit.

Optionally, the special-figure design ribbon for connecting back contact cells connects a first cell to a second cell, and the body includes a first connecting portion covering the first cell, a second connecting portion covering the second cell, and a third connecting portion covering a gap between the first cell and the second cell;

dimensions of the special-figure design ribbon for connecting back contact cells satisfy the following relationship:

$d1=L2$, and/or $d1=L3$, where $d1$ is a width of the first connecting portion, $L2$ is the length of the second slit, and $L3$ is the length of the third slit.

Optionally, a distance between two adjacent slits in the set of slits satisfies the following relationship:

$0.2<L1:(S1+S2)<1.5$, where $L1$ is the length of the first slit, $S1$ is a distance between the first slit and the second slit, and $S2$ is a distance between the second slit and the fourth slit; and/or $0.2<L1:(S3+S4)<1.5$, where $L1$ is the length of the first slit, $S3$ is a distance between the first slit and the third slit, and $S4$ is a distance between the third slit and the fifth slit.

Optionally, each first solder joint corresponds to a set of slits, and a slit in the set of slits at a larger distance from the corresponding first solder joint in a length direction is at a smaller distance from the corresponding first solder joint in the width direction; and/or each second solder joint corresponds to a set of slits, and a slit in the set of slits at a larger distance from the corresponding second solder joint in a length direction is at a smaller distance from the corresponding second solder joint in the width direction.

Optionally, each first solder joint corresponds to a set of slits, and distances between two adjacent slits in the set of slits are equal; and/or each second solder joint corresponds to a set of slits, and distances between two adjacent slits in the set of slits are equal.

Optionally, a plurality of slits is provided, and directions in which the plurality of slits stretch are parallel to the width direction of the body.

Optionally, a width of the each slit ranges from 0.2 mm to 0.6 mm.

Optionally, a spacing between two adjacent slits ranges from 1.5 mm to 4 mm.

Optionally, a spacing between two adjacent sets of the slits ranges from 1.5 mm to 15 mm.

Optionally, the body further comprises a via, and another end of the slit is in communication with the via.

Optionally, the first solder joints are connected to the first cell, the second solder joints are connected to the second cell, the via is in an elliptical shape, a length of a short axis of the via is a width of the gap between the first cell and the second cell, and a long axis of the via coincides with a center line of the body.

Optionally, the via is in an elliptical shape, a circular shape, a semicircular shape, or a rhombus shape.

Optionally, two adjacent ones of a set of vias corresponding to each first solder joint are staggered from each other in the length direction.

Optionally, a width of the body ranges from 2.3 mm to 6 mm.

Optionally, a spacing between the first solder joint and the second solder joint adjacent to each other in the width direction of the body ranges from 5 mm to 15 mm.

Optionally, a thickness of the special-figure design ribbon for connecting back contact cells ranges from 0.1 mm to 0.3 mm.

Optionally, the special-figure design ribbon for connecting back contact cells includes a copper substrate and a tin layer coated on the copper substrate. Alternatively, the special-figure design ribbon for connecting back contact cells includes an aluminum substrate and a tin layer coated on the aluminum substrate. Alternatively, the special-figure design ribbon for connecting back contact cells is an aluminum strip. Alternatively, the special-figure design ribbon for connecting back contact cells is a tin strip.

Optionally, the plurality of first solder joints are equidistantly arranged on the first side of the body in a length direction of the body; and/or the plurality of second solder joints are equidistantly arranged on the second side of the body in the length direction of the body.

Optionally, the body is in a rectangular shape. Alternatively, the body is in a bent shape, and the plurality of first solder joints and the plurality of second solder joints are disposed at bent corners.

Optionally, each first solder joint is in a rectangular shape, a rounded rectangular shape, a circular shape, a semicircular shape, or a trapezoid shape; and/or each second solder joint is in a rectangular shape, a rounded rectangular shape, a circular shape, a semicircular shape, or a trapezoid shape.

Optionally, an included angle ranging from 20° to 60° is formed between a line connecting each first solder joint to each second solder joint closest to the first solder joint and a length direction of the ribbon.

Optionally, the special-figure design ribbon for connecting back contact cells connects a first cell to a second cell, each first solder joint is connected to a positive electrode of the first cell, each second solder joints are connected to a negative electrode of the second cell, and an area of the first solder joint is greater than or equal to an area of the second solder joint; or each first solder joint is connected to a negative electrode of the first cell, each second solder joints are connected to a positive electrode of the second cell, and the area of the second solder joint is greater than or equal to the area of the first solder joint.

In the special-figure design ribbon for connecting back contact cells according to the embodiments of this application, since the plurality of first solder joints and the plurality of second solder joints respectively located on two sides of the body are staggered from each other in the width direction of the body, and/or the first solder joints and the second solder joints have different shapes. Therefore, expansion stress may be more effectively absorbed by means of deformation of the special-figure design ribbon for connecting back contact cells, thereby minimizing the damage of the stress to the solar cells.

DETAILED DESCRIPTION

To make objectives, technical solutions, and advantages of this application clearer and more comprehensible, this application is further described in detail with reference to the accompanying drawings and embodiments. It is to be understood that the specific embodiments described herein are merely used for explaining this application but are not intended to limit this application.

Figure 1:
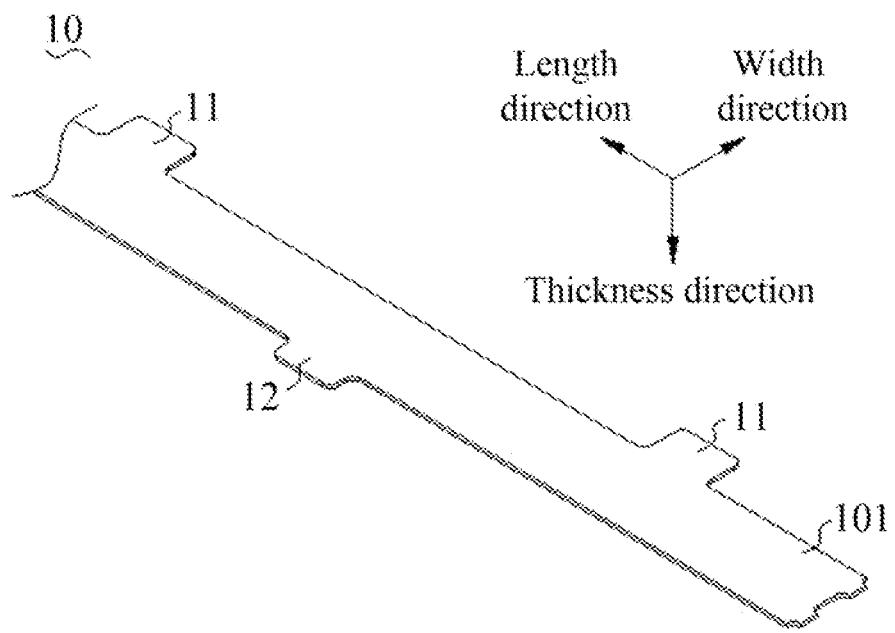
FIG. 1 is a schematic diagram of a part of a structure of a special-figure design ribbon for connecting back contact cells according to an embodiment of this application.
Figure 2:
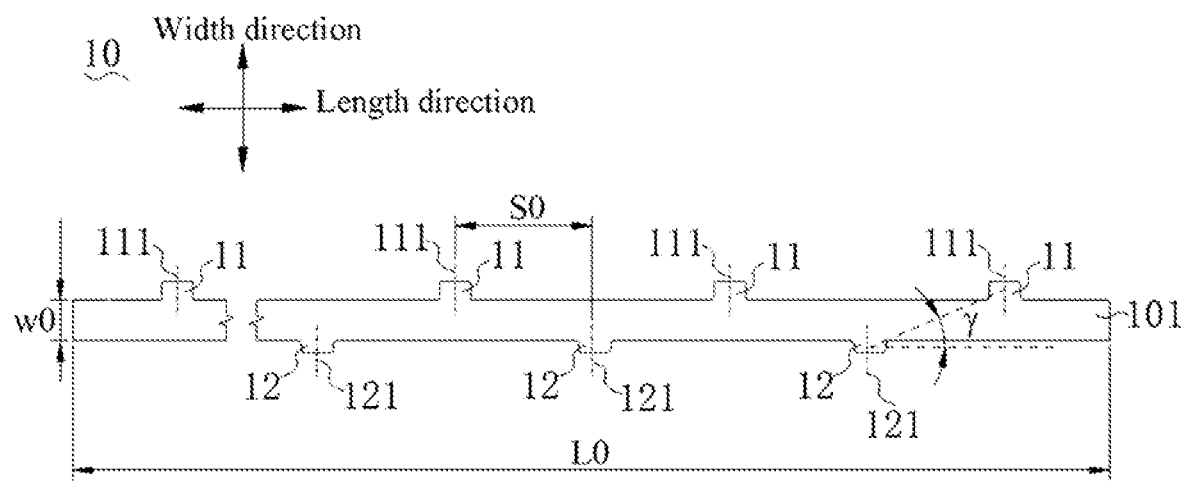
FIG. 2 is a schematic structural diagram of a special-figure design ribbon for connecting back contact cells according to an embodiment of this application.

Referring to FIG. 1 and FIG. 2, a special-figure design ribbon 10 for connecting back contact cells according to an embodiment of this application includes a body 101, a plurality of first solder joints 11, and a plurality of second solder joints 12. The plurality of first solder joints 11 and the plurality of second solder joints 12 are respectively located on two sides of the body 101 in a width direction. Each of the first solder joints 11 stretches outward from a first side of the body 101. Each of the second solder joints 12 stretches outward from a second side of the body 101. A shape of each first solder joint 11 is different from a shape of each second solder joint 12. Center lines of at least one set of the first solder joint 11 and the second solder joint 12 adjacent to each other are staggered from each other in the width direction of the body 101.

In the special-figure design ribbon 10 for connecting back contact cells according to the embodiments of this application, since the plurality of first solder joints 11 and the plurality of second solder joints 12 respectively located on two sides of the body 101 are staggered from each other in the width direction of the body 101, and/or the first solder joints 11 and the second solder joints 12 have different shapes. Therefore, expansion stress may be more effectively absorbed by means of deformation of the special-figure design ribbon 10 for connecting back contact cells, thereby minimizing the damage of the stress to the solar cells.

It may be understood that the ribbon 10 absorbs stresses in a length direction, the width direction, and a thickness direction by means of deformation.

Specifically, in the case of the deformation of the ribbon 10, a position closer to the first solder joint 11 or the second solder joint 12 is subjected to a larger stress on a line segment formed by connecting the first solder joint 11 to the second solder joint 12 adjacent to each other.

It may be understood that different shapes or staggered center lines of the solder joints on the two sides may cause the special-figure design ribbon 10 for connecting back contact cells to be asymmetrical.

It may be understood that the solder joints on the two sides of the body 101 are staggered from each other, so that the body 101 between the solder joints is longer to absorb a stress deformation quantity, thereby absorbing tensile deformation and twist deformation more effectively.

It may be understood that the term that "a shape of each first solder joint 11 is different from a shape of each second solder joint 12, and/or center lines of at least one set of the first solder joint 11 and the second solder joint 12 adjacent to each other are staggered from each other in the width direction of the body 101" includes following three situations. The shape of the first solder joint 11 is different from the shape of the second solder joint 12, and the center lines of at least one set of the first solder joint 11 and the second solder joint 12 adjacent to each other are staggered from each other in the width direction of the body 101. The shape of the first solder joint 11 is different from the shape of the second solder joint 12, and the center lines of all of the first solder joints 11 and the second solder joints 12 adjacent to each other coincide in the width direction of the body 101. The shape of the first solder joint 11 is same as the shape of the second solder joint 12, and the center lines of at least one set of the first solder joint 11 and the second solder joint 12 adjacent to each other are staggered from each other in the width direction of the body 101. The last situation is used as an example for explanation and description herein, but this does not constitute a limitation on the above situations.

It may be understood that the term that "center lines of at least one set of the first solder joint 11 and the second solder joint 12 adjacent to each other are staggered from each other in the width direction of the body 101" may mean that the center lines of a set of the first solder joint 11 and the second solder joint 12 adjacent to each other are staggered from each other in the width direction of the body 101, or may mean that the center lines of a plurality of sets of the first solder joints 11 and the second solder joints 12 adjacent to each other are staggered from each other in the width direction of the body 101, and the rest center lines of the first solder joints 11 and the second solder joints 12 adjacent to each other coincide in the width direction of the body 101, or may mean that the center lines of all of the first solder joints 11 and the second solder joints 12 adjacent to each other are staggered from each other in the width direction of the body 101. The last situation is used as an example for explanation and description herein, but this does not constitute a limitation on the above situations.

It may be understood that the term of "being staggered from each other in the width direction of the body 101" means not overlapping in the width direction.

It may be understood that a center line 111 of the first solder joint is a line that passes through a center of the first solder joint 11 and is parallel to the width direction. A center line 121 of the second solder joint 12 is a line that passes through a center of the second solder joint 12 and is parallel to the width direction.

Referring to FIG. 2, optionally, an included angle γ of 20° to 60° is formed between a line connecting each first solder joint 11 to each second solder joint 12 closest to the first solder joint 11 and a length direction of the ribbon 10. Therefore, the first solder joint 11 and the second solder joint 12 are staggered from each other by an appropriate degree, which facilitates more effective absorption of the expansion stress by means of the deformation of the ribbon 10, thereby minimizing the damage of the stress to the cells.

Specifically, the included angle γ is, for example, 21°, 23°, 30°, 32°, 35°, 39°, 40°, 45°, 50°, 55°, or 60°.

Further, 20°<γ<40°. The included angle is, for example, 21°, 23°, 30°, 32°, 35°, or 39°.

Preferably, γ is 23°. In this way, the first solder joint 11 and the second solder joint can be staggered from each other by the most appropriate degree.

Referring to FIG. 2, optionally, a thickness of the special-figure design ribbon 10 for connecting back contact cells ranges from 0.1 mm to 0.3 mm. For example, the thickness is 0.1 mm, 0.12 mm, 0.14 mm, 0.18 mm, 0.2 mm, 0.21 mm, 0.25 mm, 0.27 mm, or 0.3 mm. Therefore, the thickness of the special-figure design ribbon 10 for connecting back contact cells is in an appropriate range, so as to avoid a poor expansion stress absorbing effect of the special-figure design ribbon 10 for connecting back contact cells or a poor mechanical strength of the special-figure design ribbon 10 for connecting back contact cells due to an excessively small thickness, and avoid relatively high costs of the special-figure design ribbon 10 for connecting back contact cells due to the excessively large thickness of the special-figure design ribbon 10 for connecting back contact cells.

Preferably, the thickness of the special-figure design ribbon 10 for connecting back contact cells is 0.14 mm. In this way, the expansion stress absorbing effect, the mechanical strength, and the costs of the special-figure design ribbon 10 for connecting back contact cells can be all taken into consideration, thereby achieving an optimal overall effect.

Referring to FIG. 2, optionally, the special-figure design ribbon 10 for connecting back contact cells includes a copper substrate and a tin layer coated on the copper substrate. In this way, the special-figure design ribbon 10 for connecting back contact cells has better conductivity, so as to achieve a desirable effect of electrically connecting the solar cells.

Specifically, a hardness of the special-figure design ribbon 10 for connecting back contact cells ranges from 40 HV to 60 HV. For example, the hardness is 40 HV, 42 HV, 45 HV, 48 HV, 50 HV, 53 HV, 55 HV, 59 HV, or 60 HV. In this way, the special-figure design ribbon 10 for connecting back contact cells has a desirable mechanical strength.

Specifically, uniformity of the tin layer is ±10%. For example, the uniformity is −10%, −8%, −5%, −2%, 0%, 1%, 5%, 7%, or 10%. In this way, the special-figure design ribbon 10 for connecting back contact cells has desirable conductivity.

Specifically, a thickness of the tin layer ranges from 6 μm to 10 μm. For example, the thickness is 6 μm, 6.2 μm, 7 μm, 7.5 μm, 8 μm, 9 μm, or 10 μm.

In other embodiments, the special-figure design ribbon 10 for connecting back contact cells may alternatively include an aluminum substrate and a tin layer coated on the aluminum substrate. Alternatively, the special-figure design ribbon 10 for connecting back contact cells is an aluminum strip. Alternatively, the special-figure design ribbon 10 for connecting back contact cells is a tin strip.

Optionally, an elongation of the special-figure design ribbon 10 for connecting back contact cells is greater than or equal to 25%. For example, the elongation is 25%, 27%, 30%, or 35%.

Referring to FIG. 2, optionally, the body 101 is in a rectangular shape. In this way, the body 101 has a relatively regular shape and is convenient to manufacture.

Figure 3:
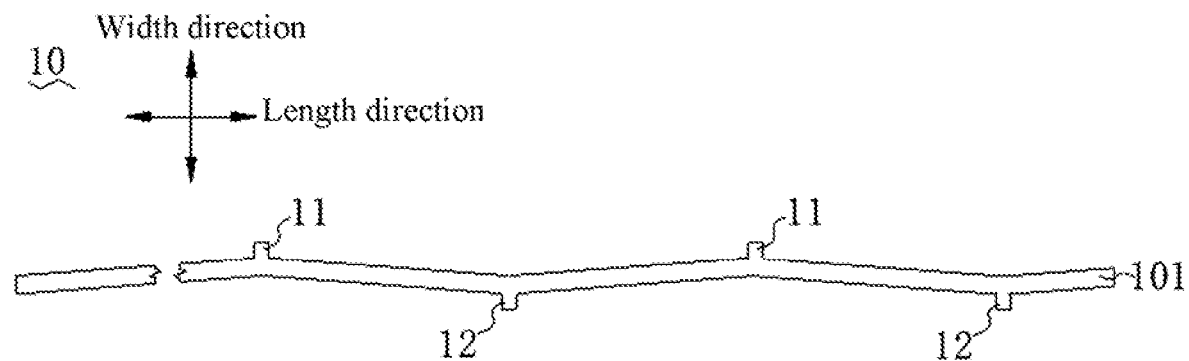
FIG. 3 is a schematic structural diagram of a special-figure design ribbon for connecting back contact cells according to an embodiment of this application.

Referring to FIG. 3, optionally, the body 101 is in a bent shape. The first solder joint 11 and the second solder joint 12 are disposed at bent corners. In this way, the stress on the solar cells can be reduced by using the body 101 in the bent shape, thereby reducing the damage to the solar cells. In addition, the bent corners may also assist in positioning the first solder joint 11 and the second solder joint 12, thereby enhancing the manufacturing efficiency. Further, the bent corners are obtuse angles. In this way, an angle of each bent corner is relatively large, so as to further reduce the stress on the solar cells. Further, the each bent corner is provided with one first solder joint 11 or one second solder joint 12.

It may be understood that, in other embodiments, the body 101 may be alternately in the rectangular shape and the bent shape, or may be in other shapes. In other embodiments, the bent corner may be an acute angle, a right angle, or an arcuate angle, or may be at least two of the acute angle, the right angle, the obtuse angle, or the arcuate angle. In other embodiments, some of the bent corners may be provided with the first solder joint 11 or the second solder joint 12, and the remaining bent corners may not be provided with the first solder joint 11 and the second solder joint 12.

Referring to FIG. 2, optionally, a width w0 of the body 101 ranges from 2.3 mm to 6 mm. For example, the width is 2.3 mm, 2.4 mm, 2.8 mm, 3 mm, 3.35 mm, 3.5 mm, 4 mm, 4.6 mm, 5 mm, 5.8 mm, or 6 mm. In this way, the width w0 of the body 101 is in an appropriate range, so as to avoid a poor expansion stress absorbing effect of the special-figure design ribbon 10 for connecting back contact cells or the special-figure design ribbon 10 for connecting back contact cells incapable of being connected to the solar cells due to an excessively small width w0 of the body 101, and avoid relatively high costs of the special-figure design ribbon 10 for connecting back contact cells due to the excessively large width w0 of the body 101. A tolerance of the width w0 of the body 101 may be ±0.1 mm.

Preferably, the width w0 of the body 101 is 3.35 mm. In this way, the expansion stress absorbing effect, connection to the solar cells, and the costs of the special-figure design ribbon 10 for connecting back contact cells can be all taken into consideration, thereby achieving an optimal overall effect.

Referring to FIG. 2, optionally, a length L0 of the body 101 ranges from 170 mm to 220 mm. For example, the length is 170 mm, 176 mm, 180 mm, 182 mm, 210 mm, 218 mm, or 220 mm. A tolerance of the length L0 of the body 101 may be ±0.1 mm.

Preferably, the length L0 of the body 101 is 176 mm.

Referring to FIG. 2, optionally, each first solder joint 11 stretches outward from a first side of the body 101 in the width direction of the body 101. Each second solder joint 12 stretches outward from the second side of the body 101 in the width direction of the body 101. In this way, the first solder joint 11 and the second solder joint 12 are regularly disposed, which is convenient for manufacturing.

It may be understood that, in other embodiments, a direction in which each first solder joint 11 stretches outward from the side of the body 101 may be at an acute angle or an obtuse angle to the width direction of the body 101. Some of the first solder joints 11 stretch outward from the side of the body 101 in the width direction of the body 101, and a direction in which the remaining first solder joints 11 stretch outward from the side of the body 101 is at an acute angle or an obtuse angle to the width direction of the body 101. A direction in which each second solder joint 12 stretches outward from the side of the body 101 may be at an acute angle or an obtuse angle to the width direction of the body 101. Some of the second solder joints 12 stretch outward from the side of the body 101 in the width direction of the body 101, and a direction in which the remaining second solder joints 12 stretch outward from the side of the body 101 is at an acute angle or an obtuse angle to the width direction of the body 101. Specifically, in a case that the direction in which the plurality of first solder joints 11 stretch outward is at an acute angle or an obtuse angle to the width direction of the body 101, corresponding angles formed by the plurality of first solder joints 11 may be the same or different. In a case that the direction in which the plurality of second solder joints 12 stretch outward is at an acute angle or an obtuse angle to the width direction of the body 101, corresponding angles formed by the plurality of second solder joints 12 may be the same or different.

Referring to FIG. 2, optionally, the plurality of first solder joints 11 are equidistantly arranged on a first side of the body 101 in a length direction of the body 101. Optionally, the plurality of second solder joints 12 are equidistantly arranged on the second side of the body 101 in the length direction of the body 101. In this way, the body 101 between the first solder joint 11 and the second solder joint 12 on each segment has the same capacity for absorbing the expansion stress, which is beneficial to further minimize the damage to the solar cells. In addition, the arrangement of the solder joints is relatively regular, which is convenient for manufacturing and can ensure that the center lines of adjacent solder joints are staggered from each other.

In other embodiments, a spacing between two adjacent first solder joints 11 may be different. Spacings between some of the two adjacent first solder joints 11 may be the same, and spacings between the remaining two adjacent first solder joints 11 may be different. Similarly, a spacing between two adjacent second solder joints 12 may be different. Spacings between some of the two adjacent second solder joints 12 may be the same, and spacings between the remaining two adjacent second solder joints 12 may be different. The specific arrangement mode of the solder joints is not limited herein.

Referring to FIG. 2, optionally, a spacing S0 between the first solder joint 11 and the second solder joint 12 adjacent to each other in the width direction of the body 101 ranges from 5 mm to 15 mm. For example, the spacing is 5 mm, 5.5 mm, 8 mm, 10 mm, 11.375 mm, 13 mm, or 15 mm. In this way, S0 may be in an appropriate range, so as to avoid poor deformability and the poor expansion stress absorbing effect caused by an excessive large or excessive small S0, which is beneficial to minimize the damage of the stress to the solar cells. A tolerance of the spacing S0 may be ±0.02.

Preferably, the spacing S0 between the first solder joint 11 and the second solder joint 12 adjacent to each other in the width direction of the body 101 is 11.375 mm. In this way, an optimal effect of reducing the damage of the stress to the solar cells can be achieved.

Optionally, the first solder joint 11 is in a rectangular shape, a rounded rectangular shape, a circular shape, a semicircular shape, or a trapezoid shape. Optionally, the second solder joint 12 is in a rectangular shape, a rounded rectangular shape, a circular shape, a semicircular shape, or a trapezoid shape.

Specifically, in an example of FIG. 2, the plurality of first solder joints 11 and the plurality of second solder joints 12 are all in the rounded rectangular shape. Further, a radius of a chamfer ranges from 0.2 mm to 0.4 mm. For example, the radius is 0.2 mm, 0.22 mm, 0.25 mm, 0.28 mm, 0.3 mm, 0.31 mm, 0.35 mm, 0.39 mm, or 0.4 mm. Preferably, the radius of the chamfer is 0.3 mm.

It may be understood that, in other examples, the first solder joint 11 and the second solder joint 12 may also have different shapes. Some of the first solder joints 11 may have the same shape, but have different shapes from the remaining first solder joints 11, or all of the first solder joints 11 may have different shapes. Some of the second solder joints 12 may have the same shape, but have different shapes from the remaining second solder joints 12, or all of the second solder joints 12 may have different shapes.

Optionally, a length of the first solder joint 11 stretching from the body 101 ranges from 1.5 mm to 1.7 mm. For example, the length is 1.5 mm, 1.52 mm, 1.55 mm, 1.6 mm, 1.63 mm, 1.65 mm, 1.68 mm, or 1.7 mm. A tolerance of the length of the first solder joint 11 stretching from the body 101 is ±0.05. Preferably, the length of the first solder joint 11 stretching from the body 101 is 1.6 mm.

Optionally, a width of the first solder joint 11 ranges from 2.4 mm to 2.6 mm. For example, the width is 2.4 mm, 2.42 mm, 2.45 mm, 2.5 mm, 2.53 mm, 2.55 mm, 2.58 mm, or 2.6 mm. A tolerance of the width of the first solder joint 11 is ±0.05. Preferably, the width of the first solder joint 11 is 2.5 mm.

Optionally, a length of the second solder joint 12 stretching from the body 101 ranges from 0.8 mm to 1.1 mm. For example, the length is 0.8 mm, 0.82 mm, 0.85 mm, 0.9 mm, 0.95 mm, 1 mm, 1.05 mm, or 1.1 mm. A tolerance of the length of the first solder joint 11 stretching from the body 101 is ±0.05. Preferably, the length of the first solder joint 11 stretching from the body 101 is 0.95 mm.

Optionally, a width of the second solder joint 12 ranges from 2.4 mm to 2.6 mm. For example, the width is 2.4 mm, 2.42 mm, 2.45 mm, 2.5 mm, 2.53 mm, 2.55 mm, 2.58 mm, or 2.6 mm. A tolerance of the width of the second solder joint 12 is ±0.05. Preferably, the width of the first solder joint 11 is 2.5 mm.

Figure 4:
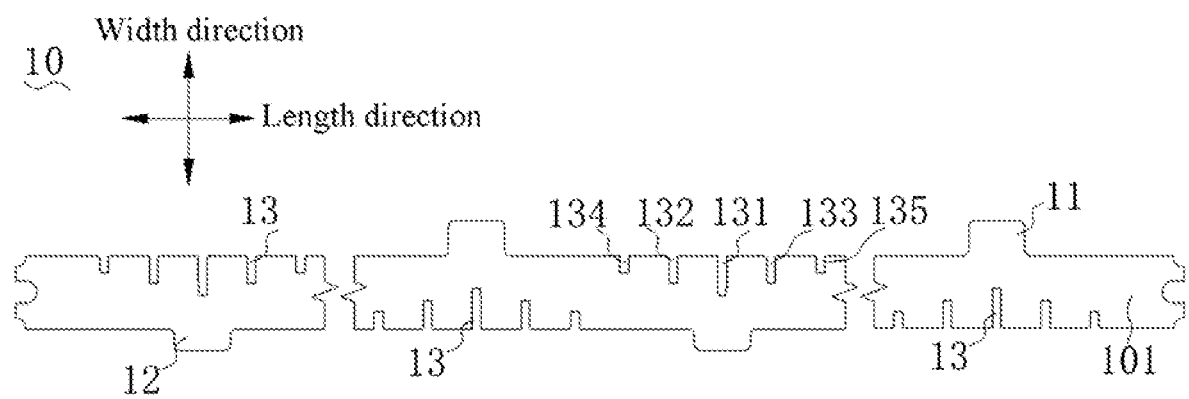
FIG. 4 is a schematic structural diagram of a special-figure design ribbon for connecting back contact cells according to an embodiment of this application.
Figure 5:
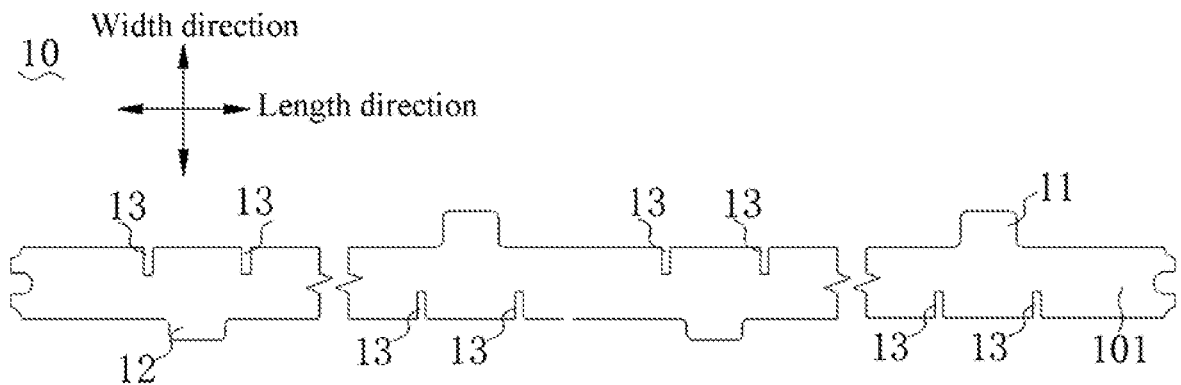
FIG. 5 is a schematic structural diagram of a special-figure design ribbon for connecting back contact cells according to an embodiment of this application.

Referring to FIG. 4 and FIG. 5, optionally, the body 101 comprises a plurality of slits 13. An end of each of the slits 13 forms an opening on the body 101. In this way, since the body 101 is provided with the slits 13 and the end of the each slit 13 forms the opening on the body 101, the deformation of the special-figure design ribbon 10 for connecting back contact cells may be absorbed by the slits 13, so as to minimize the damage of the stress to the solar cells.

It may be understood that, when the special-figure design ribbon 10 for connecting back contact cells is subjected to the stress, the slits 13 are contracted or expanded, so that the expansion stress can be more effectively absorbed by means of the deformation of the slits 13.

It may be understood that, the slit 13 is long and narrow, one end and another end of the slit 13 are two ends of the slit 13 in a length direction.

Specifically, in the examples of FIG. 4 and FIG. 5, the slit 13 is in a rectangular shape. In this way, the slit 13 has a relatively regular form and is convenient to manufacture. It may be understood that, in other examples, the slit 13 may also be in an oval shape, a runway shape, or other irregular shapes.

Further, in a case that the slit 13 is in the rectangular shape and the length direction of the slit 13 coincides with the width direction of the body 101, a length of the slit 13 is a dimension of the slit 13 in the width direction of the body 101. A width of the slit 13 is a dimension of the slit 13 in the length direction of the body 101.

Specifically, in the examples of FIG. 4 and FIG. 5, a plurality of slits 13 are provided. Therefore, the capacity of the special-figure design ribbon 10 for connecting back contact cells for absorbing the expansion stress becomes stronger by using the plurality of slits 13, thereby further reducing the damage of the stress to the solar cells. It may be understood that, in other embodiments, a quantity of the slits 13 may be one.

Specifically, in the examples of FIG. 4 and FIG. 5, openings of the slits 13 are formed on two sides of the body 101 in the width direction. In this way, a deformation range of the body 101 may be expanded by means of the deformation of the slits 13 on the two sides in the width direction, so that the capacity of the special-figure design ribbon 10 for connecting back contact cells for absorbing the expansion stress becomes stronger, thereby further reducing the damage of the stress to the solar cells. It may be understood that, in other embodiments, the opening of the slit 13 may also be formed on only a first side of the body 101 in the width direction, or may be formed on one side or two sides of the body 101 in the length direction.

Referring to FIG. 4, optionally, each first solder joint 11 corresponds to a set of slits 13. A slit in the set of slits 13 at a larger distance from the corresponding first solder joint 11 in a length direction is at a larger distance from the corresponding first solder joint 11 in the width direction. Optionally, each second solder joint 12 corresponds to a set of slits 13. A slit in the set of slits 13 at a larger distance from the corresponding second solder joint 12 in a length direction is at a larger distance from the corresponding second solder joint 12 in the width direction. In this way, a current can be more effectively transmitted by the special-figure design ribbon 10 for connecting back contact cells, and the special-figure design ribbon 10 for connecting back contact cells has a better effect of absorbing the stress.

Specifically, a quantity of the slits 13 in the set of slits 13 corresponding to the first solder joint 11 is 5, and a quantity of the slits 13 in the set of slits 13 corresponding to the second solder joint 12 is 5.

It may be understood that, in other embodiments, the quantity of the slits 13 in the set of slits 13 corresponding to the first solder joint 11 may alternatively be different from the quantity of the slits 13 in the set of slits 13 corresponding to the second solder joint 12. The quantity of the slits 13 in the set of slits 13 corresponding to the first solder joint 11 may be 2, 3, 4, 6, or more. The quantity of the slits 13 in the set of slits 13 corresponding to the second solder joint 12 may be 2, 3, 4, 6, or more.

It may be understood that, in other embodiments, each first solder joint 11 may alternatively correspond to the set of slits 13. A slit in the set of slits 13 at a larger distance from the corresponding first solder joint 11 in a length direction is at a smaller distance from the corresponding first solder joint 11 in the width direction. In other embodiments, each second solder joint 12 may alternatively correspond to the set of slits 13. A slit in the set of slits 13 at a larger distance from the corresponding second solder joint 12 in a length direction is at a smaller distance from the corresponding second solder joint 12 in the width direction. In this way, a current may also be more effectively transmitted by the special-figure design ribbon 10 for connecting back contact cells, and the special-figure design ribbon 10 for connecting back contact cells has a better effect of absorbing the stress.

Referring to FIG. 4, optionally, in a case that the quantity of the slits 13 in the set of slits 13 corresponding to the first solder joint 11 is an odd number, the set of slits 13 are symmetrical about a center line of the middle slit 13. In this way, the symmetrical arrangement of the set of slits 13 is convenient for manufacturing, and the expansion stress can be more effectively absorbed by means of the deformation of the special-figure design ribbon 10 for connecting back contact cells.

It is to be noted that the center line of the slit 13 is a line that passes through a center of the slit 13 and is parallel to the width direction.

Further, the center line of the middle slit 13 coincides with the center line 111 of the corresponding first solder joint. In this way, the middle slit 13 is conveniently positioned according to the first solder joint 11, or the first solder joint 11 is conveniently positioned according to the middle slit 13, thereby facilitating enhancement of the production efficiency.

Similarly, in a case that the quantity of the slits 13 in the set of slits 13 corresponding to the second solder joint 12 is an odd number, the set of slits 13 are symmetrical about the center line of the middle slit 13. In this way, the symmetrical arrangement of the set of slits 13 is convenient for manufacturing, and the expansion stress can be more effectively absorbed by means of the deformation of the special-figure design ribbon 10 for connecting back contact cells.

Further, the center line of the middle slit 13 coincides with the center line of the corresponding second solder joint 12. In this way, the middle slit 13 is conveniently positioned according to the second solder joint 12, or the second solder joint 12 is conveniently positioned according to the middle slit 13, thereby facilitating enhancement of the production efficiency.

Referring to FIG. 5, optionally, distances between the set of slits 13 corresponding to the first solder joint 11 and the corresponding first solder joint 11 may be equal in the width direction, or may be equal in the length direction. Therefore, this facilitates manufacturing and facilitates enhancement of the production efficiency.

Specifically, the quantity of the slits 13 in the set of slits 13 corresponding to the first solder joint 11 is 2, and the two slits are symmetrical about the center line 111 of the first solder joint. In the set of slits 13 corresponding to the second solder joint 12, the quantity of the slits 13 is 2, and the two slits are symmetrical about a center line of the second solder joint 12.

Referring to FIG. 5, optionally, in a case that the quantity of the slits 13 in the set of slits 13 corresponding to the first solder joint 11 is an even number, the set of slits 13 are symmetrical about center lines of the two middle slits 13. In this way, the symmetrical arrangement of the set of slits 13 is convenient for manufacturing, and the expansion stress can be more effectively absorbed by means of the deformation of the special-figure design ribbon 10 for connecting back contact cells.

It is to be noted that the center lines of the two middle slits 13 are lines that pass through centers of the two middle slits 13 and are parallel to the width direction.

Further, the center lines of the two middle slits 13 coincide with the center line 111 of the corresponding first solder joint. In this way, the two middle slits 13 are conveniently positioned according to the first solder joint 11, or the first solder joint 11 is conveniently positioned according to the two middle slits 13, thereby facilitating enhancement of the production efficiency.

Similarly, in a case that the quantity of the slits 13 in the set of slits 13 corresponding to the second solder joint 12 is an even number, the set of slits 13 are symmetrical about the center lines of the two middle slits 13. In this way, the symmetrical arrangement of the set of slits 13 is convenient for manufacturing, and the expansion stress can be more effectively absorbed by means of the deformation of the special-figure design ribbon 10 for connecting back contact cells.

Further, the center lines of the two middle slits 13 coincide with the center line of the corresponding second solder joint 12. In this way, the two middle slits 13 are conveniently positioned according to the second solder joint 12, or the second solder joint 12 is conveniently positioned according to the two middle slits 13, thereby facilitating enhancement of the production efficiency.

Figure 6:
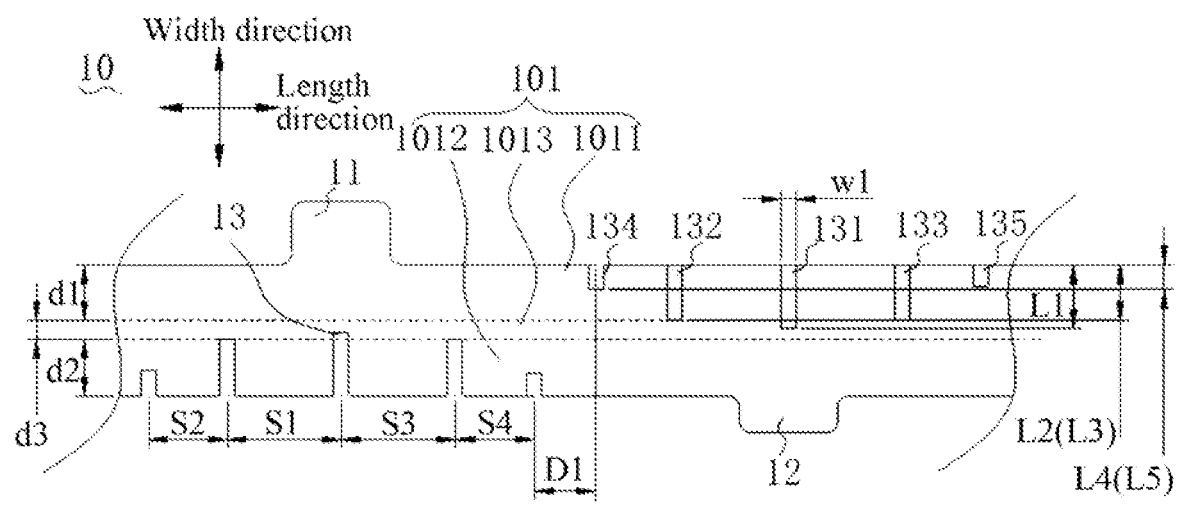
FIG. 6 is a schematic diagram of a part of a structure of a special-figure design ribbon for connecting back contact cells according to an embodiment of this application.

Referring to FIG. 6, optionally, a set of slits 13 include a first slit 131, a second slit 132, a third slit 133, a fourth slit 134, and a fifth slit 135. The first slit 131 is located in the middle of the set of slits 13. The second slit 132 and the third slit 133 are respectively located on two sides of the first slit 131. The fourth slit 134 is located on a side of the second slit 132 facing away from the first slit 131. The fifth slit 135 is located on a side of the third slit 133 facing away from the first slit 131. Lengths of the set of slits 13 satisfy the following relationship:

$L1>L2=L3>L4=L5$, where $L1$ is a length of the first slit 131, $L2$ is a length of the second slit 132, $L3$ is a length of the third slit 133, $L4$ is a length of the fourth slit 134, and $L5$ is a length of the fifth slit 135.

In this way, a slit in the five slits 13 at a larger distance from the corresponding solder joints in the length direction is at a larger distance from the corresponding solder joints in the width direction. In addition, the lengths of the five slits 13 are symmetrical about the first slit 131 in the middle, so that the expansion stress can be more effectively absorbed by means of the deformation of the special-figure design ribbon 10 for connecting back contact cells.

Referring to FIG. 6, optionally, the length $L1$ of the first slit 131 ranges from 1.75 mm to 1.85 mm. For example, the length is 1.75 mm, 1.8 mm, 1.82 mm, 1.83 mm, 1.84 mm, or 1.85 mm. Preferably, the length $L1$ of the first slit 131 is 1.8 mm.

Optionally, the length $L2$ of the second slit 132 ranges from 1.5 mm to 1.7 mm. For example, the length is 1.5 mm, 1.55 mm, 1.58 mm, 1.6 mm, 1.65 mm, or 1.7 mm. Preferably, the length $L2$ of the second slit 132 is 1.6 mm.

Optionally, the length $L3$ of the third slit 133 ranges from 1.5 mm to 1.7 mm. For example, the length is 1.5 mm, 1.55 mm, 1.58 mm, 1.6 mm, 1.65 mm, or 1.7 mm. Preferably, the length $L3$ of the third slit 133 is 1.6 mm.

Optionally, the length $L4$ of the fourth slit 134 ranges from 0.6 mm to 0.8 mm. For example, the length is 0.6 mm, 0.65 mm, 0.68 mm, 0.7 mm, 0.75 mm, or 0.8 mm. Preferably, the length $L4$ of the fourth slit 134 is 0.7 mm.

Optionally, the length $L5$ of the fifth slit 135 ranges from 0.6 mm to 0.8 mm. For example, the length is 0.6 mm, 0.65 mm, 0.68 mm, 0.7 mm, 0.75 mm, or 0.8 mm. Preferably, the length $L5$ of the fifth slit 135 is 0.7 mm.

Referring to FIG. 6, optionally, the special-figure design ribbon 10 for connecting back contact cells connects a first cell to a second cell. The body 101 includes a first connecting portion 1011 covering the first cell, a second connecting portion 1012 covering the second cell, and a third connecting portion 1013 covering a gap between the first cell and the second cell. Dimensions of the special-figure design ribbon 10 for connecting back contact cells satisfy the following relationship:

d1=L2, and/or d1=L3, where d1 is a width of the first connecting portion 1011, L2 is the length of the second slit 132, and L3 is the length of the third slit 133.

In this way, the length(s) of the second slit 132 and/or the third slit 133 may equal the width of the first connecting portion 1011, so that a part of the body 101 in contact with the solar cells has stronger deformability and a stronger capability of absorbing the expansion stress, thereby further reducing the damage of the stress to the solar cells.

Referring to FIG. 6, optionally, a distance between two adjacent slits 13 in the set of slits 13 satisfies the following relationship:

$0.2 < L1:(S1+S2) < 1.5$, where

L1 is the length of the first slit 131, S1 is a distance between the first slit 131 and the second slit 132, and S2 is a distance between the second slit 132 and the fourth slit 134; and/or $0.2 < L1:(S3+S4) < 1.5$, where L1 is the length of the first slit 131, S3 is a distance between the first slit 131 and the third slit 133, and S4 is a distance between the third slit 133 and the fifth slit 135.

In this way, the distance between two adjacent slits 13 in the set of slits 13 is related to the length of the first slit 131, thereby more effectively absorbing the expansion stress and minimizing the damage of the stress to the solar cells.

Specifically, a value of L1: (S3+S4) is, for example, 0.21, 0.22, 0.37, 0.8, 0.9, 1, 1.3, or 1.49.

In an example of FIG. 6, the value of L1: (S3+S4) is 0.37. L1 is 1.8 mm, S3 is 2.9 mm, and S4 is 2 mm.

Referring to FIG. 6, optionally, the width d1 of the first connecting portion 1011 ranges from 1.5 mm to 1.7 mm. For example, the width is 1.5 mm, 1.55 mm, 1.58 mm, 1.6 mm, 1.65 mm, or 1.7 mm. Preferably, the width d1 of the first connecting portion 1011 is 1.6 mm.

Optionally, a width d2 of the second connecting portion 1012 ranges from 1.5 mm to 1.7 mm. For example, the width is 1.5 mm, 1.55 mm, 1.58 mm, 1.6 mm, 1.65 mm, or 1.7 mm. Preferably, the width d2 of the second connecting portion 1012 is 1.6 mm.

Optionally, a width d3 of the third connecting portion 1013 ranges from 0.1 mm to 2 mm. For example, the width is 0.1 mm, 0.12 mm, 0.15 mm, 0.18 mm, 0.2 mm, 0.8 mm, 1 mm, 1.5 mm, 1.7 mm, or 2 mm. Preferably, the width d3 of the third connecting portion 1013 is 0.15 mm.

Optionally, the special-figure design ribbon 10 for connecting back contact cells connects the first cell to the second cell. The first solder joint 11 is connected to a positive electrode of the first cell. The second solder joint 12 is connected to a negative electrode of the second cell. An area of the first solder joint 11 is greater than or equal to an area of the second solder joint 12. Alternatively, the first solder joint 11 is connected to a negative electrode of the first cell. The second solder joint 12 is connected to a positive electrode of the second cell. The area of the second solder joint is greater than or equal to the area of the first solder joint.

It may be understood that, since a current of the positive electrode is larger than that of the negative electrode, the width of the connecting portion corresponding to the positive electrode may be larger, so that a structure of the ribbon can better match the current of the cell.

Specifically, the area of the first solder joint 11 is greater than or equal to the area of the second solder joint 12. The first solder joint 11 and the second solder joint 12 may have the same width, and the length of the first solder joint 11 is greater than the length of the second solder joint 12. Alternatively, the first solder joint 11 and the second solder joint 12 may have the same length, and the width of the first solder joint 11 is greater than the width of the second solder joint 12. Alternatively, the length of the first solder joint 11 is greater than the length of the second solder joint 12, and the width of the first solder joint 11 is greater than the width of the second solder joint 12.

Referring to FIG. 6, optionally, a plurality of slits 13 are provided, and directions in which the plurality of slits 13 stretch are all parallel to the width direction of the body 101. In this way, more expansion stresses in the length direction of the body 101 can be absorbed, thereby reducing the damage of the stress to the solar cells. In addition, the directions in which the plurality of slits 13 stretch are parallel to each other, which is convenient for manufacturing and facilitates the enhancement of the production efficiency.

It may be understood that, in other embodiments, the directions in which all of the slits 13 stretch are all at an angle to the width direction of the body 101. Directions in which some of the slits 13 stretch may be at an angle to the width direction of the body 101, and the directions in which the rest of the slits 13 stretch are parallel to the width direction of the body 101. Further, in a case that the directions in which the plurality of slits 13 stretch are at an angle to the width direction of the body 101, the plurality of slits 13 may or may not be parallel to each other.

Referring to FIG. 6, optionally, a width w1 of the slit 13 ranges from 0.2 mm to 0.6 mm. For example, the width is 0.2 mm, 0.3 mm, 0.4 mm, 0.5 mm, or 0.6 mm. In this way, the width w1 of the slit 13 is in an appropriate range, so as to avoid poor deformability of the special-figure design ribbon 10 for connecting back contact cells due to an excessively small width w1 of the slit 13, and avoid a relatively poor strength of the special-figure design ribbon 10 for connecting back contact cells due to the excessively large width w1 of the slit 13. A tolerance of the width w1 of the slit 13 may be ±0.05.

Preferably, the width w1 of the slit 13 is 0.4 mm. In this way, the deformability and the mechanical strength of the special-figure design ribbon 10 for connecting back contact cells can be all taken into consideration, thereby achieving an optimal overall effect.

Specifically, in the example of FIG. 6, the width w1 of the slit 13 is a dimension of the slit 13 in the length direction of the body 101.

Referring to FIG. 6, optionally, a spacing between two adjacent slits 13 ranges from 1.5 mm to 4 mm. For example, the spacing is 1.5 mm, 1.8 mm, 1.9 mm, 2.0 mm, 2.5 mm, 2.9 mm, 3 mm, 3.5 mm, or 4 mm. In this way, the spacing between the two adjacent slits 13 is in an appropriate range, so as to avoid a relatively poor mechanical strength of the special-figure design ribbon 10 for connecting back contact cells due to an excessively small spacing between the two adjacent slits 13, and avoid relatively poor deformability of the special-figure design ribbon 10 for connecting back contact cells due to the excessively large spacing between the two adjacent slits 13.

Specifically, the spacing between the two adjacent slits 13 is a distance between the center lines of the two adjacent slits 13. In FIG. 6, S1 is the distance between the first slit 131 and the second slit 132, which is 2.9 mm. S2 is the distance between the second slit 132 and the fourth slit 134, which is 2 mm. S3 is the distance between the first slit 131 and the third slit 133, which is 2.9 mm. S4 is the distance between the third slit 133 and the fifth slit 135, which is 2 mm. A tolerance is ±0.01.

Specifically, in the set of slits 13, the spacing between the two adjacent slits 13 may be the same or different. In a case that the spacings between the two adjacent slits 13 are the same, the spacing between the two adjacent slits 13 is a fixed value within a range of 1.5 mm to 4 mm. In a case that the spacing between the two adjacent slits 13 is different, the spacing between the two adjacent slits 13 is a plurality of values within the range of 1.5 mm to 4 mm.

Referring to FIG. 6, optionally, a spacing D1 between two adjacent sets of the slits 13 ranges from 1.5 mm to 15 mm. For example, the spacing is 1.5 mm, 1.575 mm, 2 mm, 5 mm, 8 mm, 10 mm, 12 mm, or 15 mm. In this way, the spacing D1 between the two adjacent sets of slits 13 is in an appropriate range, so as to avoid a relatively poor mechanical strength of the special-figure design ribbon 10 for connecting back contact cells due to an excessively small spacing D1 between the two adjacent sets of slits 13, and avoid relatively poor deformability of the special-figure design ribbon 10 for connecting back contact cells due to the excessively large spacing D1 between the two adjacent sets of slits 13. Preferably, the spacing D1 between two adjacent sets of slits 13 is 1.575 mm.

Specifically, the spacing between two adjacent sets of slits 13 is a distance between two slits 13 in two sets of slits 13 and closest to each other.

Figure 7:
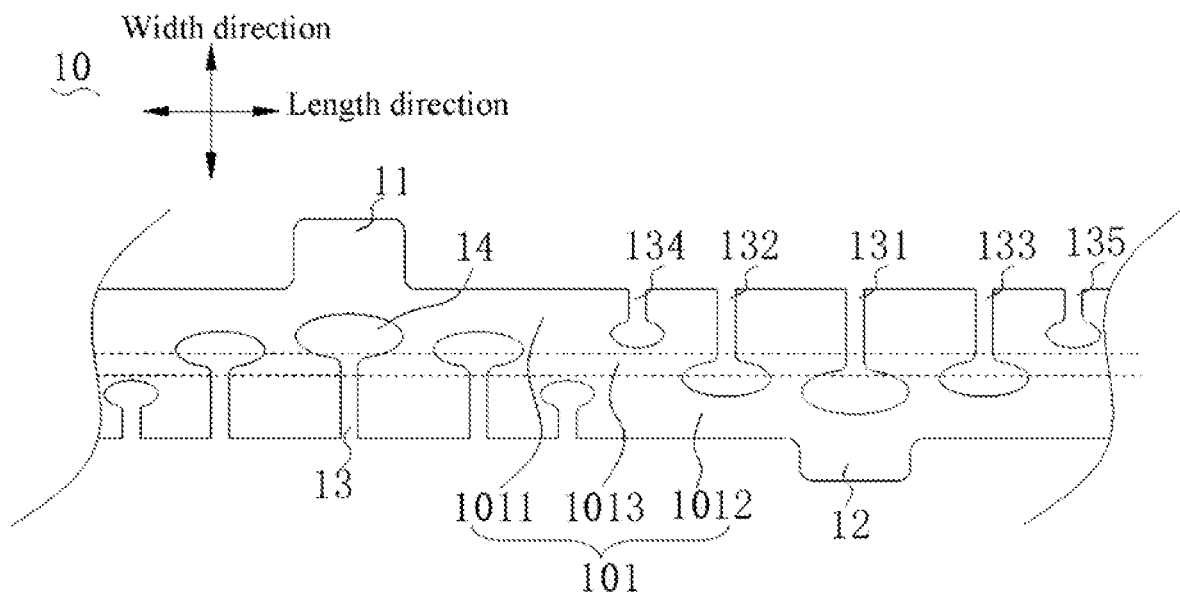
FIG. 7 is a schematic diagram of a part of a structure of a special-figure design ribbon for connecting back contact cells according to an embodiment of this application.

Referring to FIG. 7, optionally, the body 101 is further provided with vias 14. Another end of the slit 13 is in communication with each of the vias 14. In this way, the deformation of the special-figure design ribbon 10 for connecting back contact cells can be absorbed through the vias 14, thereby reducing the damage of the stress to the solar cells. In addition, the slits 13 are in communication with the vias 14, thereby achieving a better effect of absorbing the deformation of the ribbon 10.

Specifically, there may be one or more vias 14. One via 14 may be in communication with one slit 13, a plurality of slits 13 are in communication with one via 14, or one slit 13 may in communication with a plurality of vias 14. A specific manner in which the slit 13 is brought into communication with the via 14 is not limited herein.

Referring to FIG. 7, the vias 14 corresponding to the second slit 132 and the third slit 133 are in an oval shape, and a length of a short axis of each via is greater than a width of the gap between the first cell and the second cell. The vias 14 corresponding to the second slit 132 and the third slit 133 are misaligned with the third connecting portion 1013.

Referring to FIG. 7, optionally, a length of a long axis of the via 14 corresponding to the first slit 131 ranges from 2.3 mm to 2.5 mm. For example, the length of the long axis is 2.3 mm, 2.32 mm, 2.38 mm, 2.4 mm, 2.45 mm, or 2.5 mm. Preferably, the length of the long axis of the via 14 corresponding to the first slit 131 is 2.4 mm.

Referring to FIG. 7, optionally, a length of a short axis of the via 14 corresponding to the first slit 131 ranges from 0.9 mm to 1.1 mm. For example, the length of the short axis is 0.9 mm, 0.92 mm, 0.95 mm, 1 mm, 1.05 mm, or 1.1 mm. Preferably, the length of the short axis of the via 14 corresponding to the first slit 131 is 1 mm.

Referring to FIG. 7, optionally, the length of the long axis of the via 14 corresponding to the second slit 132 ranges from 1.9 mm to 2.1 mm. For example, the length of the long axis is 1.9 mm, 1.92 mm, 1.95 mm, 2 mm, 2.05 mm, 2.07 mm, or 2.1 mm. Preferably, the length of the long axis of the via 14 corresponding to the second slit 132 is 2 mm.

Referring to FIG. 7, optionally, the length of the short axis of a via 14 corresponding to the second slit 132 ranges from 0.75 mm to 0.85 mm. For example, the length of the short axis is 0.75 mm, 0.76 mm, 0.78 mm, 0.8 mm, 0.81 mm, 0.84 mm, or 0.85 mm. Preferably, the length of the short axis of the via 14 corresponding to the second slit 132 is 0.8 mm.

Referring to FIG. 7, optionally, the length of the long axis of the via 14 corresponding to the third slit 133 ranges from 1.9 mm to 2.1 mm. For example, the length of the long axis is 1.9 mm, 1.92 mm, 1.95 mm, 2 mm, 2.05 mm, 2.07 mm, or 2.1 mm. Preferably, the length of the long axis of the via 14 corresponding to the third slit 133 is 2 mm.

Referring to FIG. 7, optionally, the length of the short axis of the via 14 corresponding to the third slit 133 ranges from 0.75 mm to 0.85 mm. For example, the length of the short axis is 0.75 mm, 0.76 mm, 0.78 mm, 0.8 mm, 0.81 mm, 0.84 mm, or 0.85 mm. Preferably, the length of the short axis of the via 14 corresponding to the third slit 133 is 0.8 mm.

Referring to FIG. 7, optionally, the length of the long axis of the via 14 corresponding to the fourth slit 134 ranges from 1.1 mm to 1.3 mm. For example, the length of the long axis is 1.1 mm, 1.11 mm, 1.14 mm, 1.2 mm, 1.25 mm, 1.27 mm, or 1.3 mm. Preferably, the length of the long axis of the via 14 corresponding to the fourth slit 134 is 1.2 mm.

Referring to FIG. 7, optionally, the length of the short axis of the via 14 corresponding to the fourth slit 134 ranges from 0.5 mm to 0.7 mm. For example, the length of the short axis is 0.5 mm, 0.51 mm, 0.58 mm, 0.6 mm, 0.64 mm, 0.68 mm, or 0.7 mm. Preferably, the length of the short axis of the via 14 corresponding to the fourth slit 134 is 0.6 mm.

Referring to FIG. 7, optionally, the length of the long axis of the via 14 corresponding to the fifth slit 135 ranges from 1.1 mm to 1.3 mm. For example, the length of the long axis is 1.1 mm, 1.11 mm, 1.14 mm, 1.2 mm, 1.25 mm, 1.27 mm, or 1.3 mm. Preferably, the length of the long axis of the via 14 corresponding to the fifth slit 135 is 1.2 mm.

Referring to FIG. 7, optionally, the length of the short axis of the via 14 corresponding to the fifth slit 135 ranges from 0.5 mm to 0.7 mm. For example, the length of the short axis is 0.5 mm, 0.51 mm, 0.58 mm, 0.6 mm, 0.64 mm, 0.68 mm, or 0.7 mm. Preferably, the length of the short axis of the via 14 corresponding to the fifth slit 135 is 0.6 mm.

Referring to FIG. 7, optionally, four rounded corners are formed at a junction of the first slit 131 and the corresponding via 14, and radii thereof are all 0.2.

Referring to FIG. 7, optionally, four rounded corners are formed at a junction of the second slit 132 and the corresponding via 14, and radii thereof are all 0.2.

Referring to FIG. 7, optionally, four rounded corners are formed at a junction of the third slit 133 and the corresponding via 14, and radii thereof are all 0.2.

Referring to FIG. 7, optionally, four rounded corners are formed at a junction of the fourth slit 134 and the corresponding via 14, and radii thereof are all 0.1.

Referring to FIG. 7, optionally, four rounded corners are formed at a junction of the fifth slit 135 and the corresponding via 14, and radii thereof are all 0.1.

Figure 8:
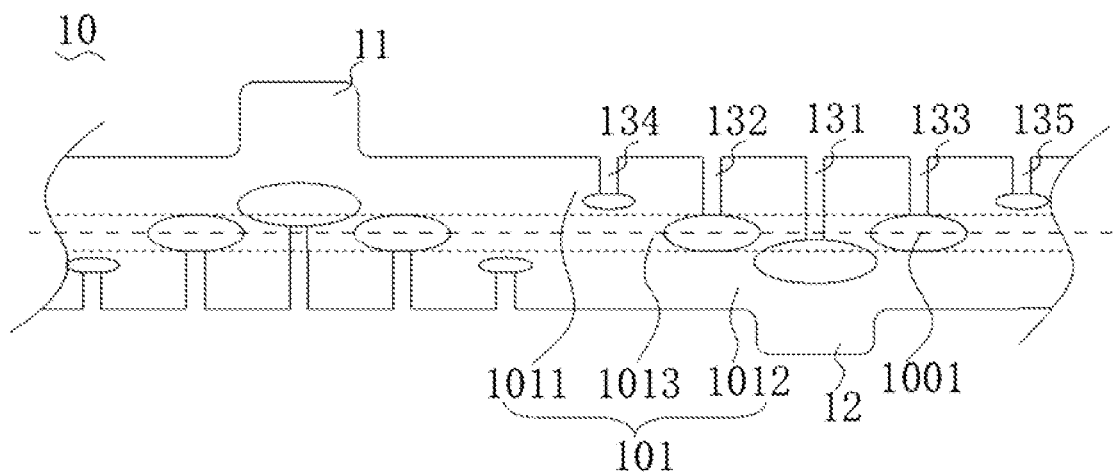
FIG. 8 is a schematic diagram of a part of a structure of a special-figure design ribbon for connecting back contact cells according to an embodiment of this application.

Referring to FIG. 8, optionally, the first solder joint 11 is connected to the first cell. The second solder joint 12 is connected to the second cell. The via 14 is in an oval shape. The length of the short axis of the via 14 is the width of the gap between the first cell and the second cell. The long axis of the via 14 coincides with a center line 1001 of the body 101.

In this way, the short axis of the via 14 is caused to be sandwiched between the first cell and the second cell and to be parallel to the width direction of the body 101. The long axis of the via 14 is parallel to the length direction of the body 101. Therefore, the effect of absorbing the deformation of the special-figure design ribbon 10 for connecting back contact cells through the via 14 can be better, thereby further reducing the damage of the stress to the solar cells.

Specifically, the long axis of the via 14 coincides with a center line of the gap between the first cell and the second cell. In this way, the effect of absorbing the deformation of the ribbon 10 through the via 14 can be better, and the damage of the stress to the cells can be further minimized.

Specifically, in an example of FIG. 8, in the vias 14 corresponding to the set of slits 13, the vias 14 corresponding to the second slit 132 and the third slit 133 are in the oval shape, the length of the short axis is the width of the gap between the first cell and the second cell, and the long axis coincides with the center line 1001 of the body 101. In this way, the deformation of the special-figure design ribbon 10 for connecting back contact cells is absorbed at other positions of the body 101 through the vias 14 corresponding to the first slit 131, the fourth slit 134, and the fifth slit 135, thereby achieving a better effect of absorbing deformation.

It may be understood that, in other examples, all of the vias 14 corresponding to the set of slits 13 may be in the oval shape, the lengths of the short axes are all the width of the gap between the first cell and the second cell, and the long axes coincide with the center line 1001 of the body 101.

It may be understood that, in other examples, the via 14 may be not only in the oval shape, but also in a circular shape, a semicircular shape, a rhombus shape, or other shapes. The shapes of the plurality of vias 14 may be the same or different, which are not limited herein.

Optionally, two adjacent vias 14 in a set of the vias 14 corresponding to each first solder joint 11 are staggered from each other in the length direction. In this way, the current can be more effectively transmitted, so as to more effectively absorb the deformation of the special-figure design ribbon 10 for connecting back contact cells.

It may be understood that, in other embodiments, the two adjacent vias 14 in the set of the vias 14 corresponding to each first solder joint 11 may partially or completely overlap in the length direction.

Referring to FIG. 7 and FIG. 8, optionally, each first solder joint 11 corresponds to the set of vias 14. An increase in distances between each of the vias and the corresponding first solder joint 11 in the length direction leads to a decrease in the long axes and the short axes of the set of the vias 14. Optionally, each second solder joint 12 corresponds to the set of the vias 14. An increase in distances between each of the vias and the corresponding second solder joint 12 in the length direction leads to a decrease in the long axes and the short axes of the set of the vias 14. In this way, a current can be more effectively transmitted by the special-figure design ribbon 10 for connecting back contact cells, and the special-figure design ribbon 10 for connecting back contact cells has a better effect of absorbing the stress.

It may be understood that, in other embodiments, each first solder joint 11 may correspond to the set of vias 14. An increase in distances between each of the vias and the corresponding first solder joint 11 in the length direction leads to an increase in the long axes and the short axes of the set of vias 14. In other embodiments, each second solder joint 12 may correspond to the set of vias 14. An increase in distances between each of the vias and the corresponding second solder joint 12 in the length direction leads to an increase in the long axes and the short axes of the set of vias 14.

Referring to FIG. 8, optionally, distances between two adjacent slits 13 in the set of slits 13 are the same.

It may be understood that, the distances between the two adjacent slits 13 in the set of slits 13 may be different, or may be partially the same, and partially different.

It will be obvious to those skilled in the art that changes and modifications may be made, and therefore, the aim in the appended claims is to cover all such changes and modifications.

What is claimed is:

1. A special-figure design ribbon for connecting back contact cells, the ribbon comprising:
    a body comprising a plurality of slits, an end of each of the slits forming an opening on the body; and
    a plurality of first solder joints and a plurality of second solder joints, respectively located on two sides of the body in a width direction;
    wherein
    each of the plurality of first solder joints stretches outward from a first side of the body;
    each of the plurality of second solder joints stretches outward from a second side of the body; and
    center lines of the plurality of first solder joints and the plurality of second solder joints adjacent to each other are staggered from each other in the width direction of the body;
    wherein,
    each of the first solder joints corresponds to one of a first set of the slits, and a slit in the first set of slits which is at a larger distance from the corresponding first solder joint in a length direction, is at a larger distance from the corresponding first solder joint in the width direction; and/or
    each of the second solder joints corresponds to one of a second set of the slits, and a slit in the second set of slits which is at a larger distance from the corresponding second solder joint in a length direction, is at a larger distance from the corresponding second solder joint in the width direction.

2. The special-figure design ribbon of claim 1, wherein the set of slits comprise a first slit, a second slit, a third slit, a fourth slit, and a fifth slit; the first slit is located in a middle of the set of slits, and the second slit and the third slit are respectively located on two sides of the first slit; the fourth slit is located on a side of the second slit facing away from the first slit, and the fifth slit is located on a side of the third slit facing away from the first slit; and
    lengths of the set of slits satisfy the following relationship:
    $L1 > L2 = L3 > L4 = L5$, wherein
    L1 is a length of the first slit, L2 is a length of the second slit, L3 is a length of the third slit, L4 is a length of the fourth slit, and L5 is a length of the fifth slit.

3. The special-figure design ribbon of claim 2, wherein the special-figure design ribbon connects a first cell to a second cell, and the body comprises a first connecting portion covering the first cell, a second connecting portion covering the second cell, and a third connecting portion covering a gap between the first cell and the second cell;
    dimensions of the special-figure design ribbon satisfy the following relationship:
    $d1 = L2$, and/or $d1 = L3$, wherein
    d1 is a width of the first connecting portion, L2 is the length of the second slit, and L3 is the length of the third slit.

4. The special-figure design ribbon of claim 2, wherein a distance between two adjacent slits in the set of slits satisfies the following relationship:

0.2<L1:(S1+S2)<1.5, wherein
- L1 is the length of the first slit, S1 is a distance between the first slit and the second slit, and S2 is a distance between the second slit and the fourth slit; and/or 0.2<L1:(S3+S4)<1.5, wherein
- L1 is the length of the first slit, S3 is a distance between the first slit and the third slit, and S4 is a distance between the third slit and the fifth slit.

5. The special-figure design ribbon of claim 1, wherein distances between two adjacent slits in the first set of slits are equal; and/or
- distances between two adjacent slits in the second set of slits are equal.

6. The special-figure design ribbon of claim 1, wherein directions in which the plurality of slits stretch is parallel to the width direction of the body.

7. The special-figure design ribbon of claim 1, wherein a width of each of the slits ranges from 0.2 mm to 0.6 mm.

8. The special-figure design ribbon of claim 1, in each set of the slits a spacing between two adjacent slits ranges from 1.5 mm to 4 mm.

9. The special-figure design ribbon of claim 1, wherein a spacing between two adjacent sets of the slits ranges from 1.5 mm to 15 mm.

10. The special-figure design ribbon for connecting back contact cells of claim 3, wherein the body further comprises vias, and another end of at least some of the slits is in communication with the vias.

11. The special-figure design ribbon of claim 10, wherein the plurality of first solder joints is connected to the first cell; the plurality of second solder joints is connected to the second cell; the via is in an elliptical shape, a length of a short axis of the via is a width of the gap between the first cell and the second cell, and a long axis of the via coincides with a center line of the body.

12. The special-figure design ribbon of claim 10, wherein the via is in an elliptical shape, a circular shape, a semicircular shape, or a rhombus shape.

13. The special-figure design ribbon of claim 10, wherein two adjacent ones of a set of the vias corresponding to each first solder joint are staggered from each other in the length direction thereof.

14. The special-figure design ribbon of claim 1, wherein a width of the body ranges from 2.3 mm to 6 mm.

15. The special-figure design ribbon of claim 1, wherein a spacing between the first solder joint and the second solder joint adjacent to each other in the width direction of the body ranges from 5 mm to 15 mm.

16. The special-figure design ribbon of claim 1, wherein a thickness of the special-figure design ribbon ranges from 0.1 mm to 0.3 mm.

17. The special-figure design ribbon of claim 1, comprising: a copper substrate and a tin layer coated on the copper substrate; or an aluminum substrate and a tin layer coated on the aluminum substrate; or the special-figure design ribbon being an aluminum strip or a tin strip.

18. The special-figure design ribbon of claim 1, wherein the plurality of first solder joints are equidistantly arranged on the first side of the body in a length direction of the body; and/or
- the plurality of second solder joints are equidistantly arranged on the second side of the body in the length direction of the body.

19. The special-figure design ribbon of claim 1, wherein the body is in a rectangular shape; or the body is in a bent shape, and the plurality of first solder joints and the plurality of second solder joints are disposed at bent corners.

20. The special-figure design ribbon of claim 1, wherein each first solder joint is in a rectangular shape, a rounded rectangular shape, a circular shape, a semicircular shape, or a trapezoid shape; and/or each second solder joint is in a rectangular shape, a rounded rectangular shape, a circular shape, a semicircular shape, or a trapezoid shape.

21. The special-figure design ribbon of claim 1, wherein an included angle ranging from 20° to 60° is formed between a line connecting each first solder joint to each second solder joint closest to the first solder joint and a length direction of the ribbon.

22. The special-figure design ribbon of claim 1, wherein the special-figure design ribbon connects a first cell to a second cell, each first solder joint is connected to a positive electrode of the first cell, each second solder joints are connected to a negative electrode of the second cell, and an area of the first solder joint is greater than or equal to an area of the second solder joint; or each first solder joint is connected to a negative electrode of the first cell, each second solder joints are connected to a positive electrode of the second cell, and an area of the second solder joint is greater than or equal to an area of the first solder joint.

* * * * *